(12) United States Patent
Jeong et al.

(10) Patent No.: US 11,164,932 B2
(45) Date of Patent: Nov. 2, 2021

(54) BACKPLANE FOR DISPLAY DEVICE AND METHOD OF MANUFACTURING THE SAME

(71) Applicant: Samsung Display Co., Ltd., Yongin-Si (KR)

(72) Inventors: Jaewoo Jeong, Suwon-si (KR); Hyungue Kim, Yongin-si (KR); Jongjun Baek, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/871,185

(22) Filed: May 11, 2020

(65) Prior Publication Data

US 2020/0273943 A1 Aug. 27, 2020

Related U.S. Application Data

(62) Division of application No. 15/715,495, filed on Sep. 26, 2017, now Pat. No. 10,692,954.

(30) Foreign Application Priority Data

Nov. 22, 2016 (KR) .................. 10-2016-0155810

(51) Int. Cl.
| | | |
|---|---|---|
| *H01L 27/32* | (2006.01) | |
| *H01L 27/12* | (2006.01) | |
| *H01L 21/3213* | (2006.01) | |
| *H01L 21/311* | (2006.01) | |
| *H01L 51/00* | (2006.01) | |
| *H01L 51/52* | (2006.01) | |
| *H01L 21/027* | (2006.01) | |

(52) U.S. Cl.
CPC ...... *H01L 27/3276* (2013.01); *H01L 21/0272* (2013.01); *H01L 21/31116* (2013.01); *H01L 21/32135* (2013.01); *H01L 21/32139* (2013.01); *H01L 27/12* (2013.01); *H01L 27/1262* (2013.01); *H01L 51/00* (2013.01); *H01L 51/5253* (2013.01); *H01L 2227/323* (2013.01)

(58) Field of Classification Search
CPC ................................................ H01L 21/32139
See application file for complete search history.

(56) References Cited

U.S. PATENT DOCUMENTS

| | | |
|---|---|---|
| 5,866,927 A | 2/1999 | Cho et al. |
| 2004/0134878 A1 | 7/2004 | Matsushita et al. |
| 2007/0034879 A1 | 2/2007 | Park et al. |

(Continued)

FOREIGN PATENT DOCUMENTS

| | | |
|---|---|---|
| KR | 100711889 B1 | 4/2007 |
| KR | 1020140093614 A | 7/2014 |
| KR | 101499235 B1 | 2/2015 |

*Primary Examiner* — Mariam Qureshi
(74) *Attorney, Agent, or Firm* — Cantor Colburn LLP

(57) ABSTRACT

A method of manufacturing a backplane for a display device includes forming an insulation layer on a substrate, forming a pad electrode layer on the insulation layer, forming a photoresist pattern on the pad electrode layer in the pad region, etching the pad electrode layer and a portion of the insulation layer by the photoresist pattern as an etch-stop layer so as to simultaneously form a pad electrode and a side protection layer, the side protection layer covering a sidewall of the pad electrode, and stripping the photoresist pattern.

8 Claims, 16 Drawing Sheets

(56) References Cited

U.S. PATENT DOCUMENTS

| | | | |
|---|---|---|---|
| 2008/0239585 A1 | 10/2008 | Ousugi et al. | |
| 2009/0072297 A1* | 3/2009 | Lee | H01L 27/10 257/324 |
| 2010/0277659 A1* | 11/2010 | Yang | H01L 27/1214 349/42 |
| 2011/0156995 A1* | 6/2011 | Choi | H01L 27/1288 345/92 |
| 2013/0134425 A1 | 5/2013 | Chung et al. | |
| 2014/0159034 A1 | 6/2014 | Yang | |
| 2015/0316804 A1 | 11/2015 | Miyamoto | |

* cited by examiner

BACKPLANE FOR DISPLAY DEVICE AND METHOD OF MANUFACTURING THE SAME

This application is a divisional of U.S. patent application Ser. No. 15/715,495, filed on Sep. 26, 2017, which claims priority to Korean Patent Application No. 10-2016-0155810, filed on Nov. 22, 2016, and all the benefits accruing therefrom under 35 U.S.C. § 119, the content of which in it's entirety is herein incorporated by reference.

BACKGROUND

1. Field

Exemplary embodiments relate to display devices. More particularly, exemplary embodiments relate to backplanes for display devices and methods of manufacturing the backplanes for the display devices.

2. Description of the Related Art

Recently, an importance of a flat panel display device, which has a small thickness, a light weight as well as low power consumption, has been increasing. A liquid crystal display device and an organic light emitting display device among the flat panel display devices are broadly commercialized due to their advantages such as excellent resolution, image quality. Particularly, the organic light emitting display device has been attracting attention due to it's advantages such as a wide viewing angle, a high contrast, and a high response speed.

The organic light emitting display device may include a display region, which displays an image, and a peripheral region, which surrounds the display region. The peripheral region may include a pad region, which transmits a signal to the display region. An organic light emitting element, which constitutes a pixel connected between a scan line and a data line as a matrix structure, may be formed in the display region. The organic light emitting element may include a pixel electrode, a common electrode and an organic light emitting layer formed therebetween. A pad electrode, which may be connected to the scan line and the data line to transmit a signal, may be formed in the pad region.

An exposed pad electrode and a pixel electrode layer adjacent to the exposed pad electrode may induce galvanic reaction in a presence of an electrolyte, when the pixel electrode layer is etched so as to form the pixel electrode. The galvanic reaction is an electrochemical process in which a metal ion is reduced based on oxidation-reduction reaction when two metals having different standard reduction potentials from each other are connected by the electrolyte. The galvanic reaction may occur when standard reduction potentials of materials included in the pixel electrode layer and the pad electrode are relatively greatly different.

SUMMARY

A pixel electrode layer may include silver (Ag), and a pad electrode may include aluminum (Al), for example. Galvanic reaction may occur between the pixel electrode layer and the pad electrode in a presence of an electrolyte because standard reduction potentials of silver (Ag) and aluminum (Al) are relatively greatly different. Silver ion (Ag+) may receive electrons from aluminum (Al) and may be reduced to silver (Ag) particle. The silver (Ag) particle may corrode the pad electrode or may short-circuit the pad electrodes.

An object of the invention is to provide a method of manufacturing a backplane for a display device in which damages on a pad electrode may be prevented when forming a pixel electrode.

An object of the invention is to provide a backplane for a display device including a pad electrode that may not be damaged when forming a pixel electrode.

In order to achieve the object of the invention described above, a method of manufacturing a backplane for a display device which includes a display region and a pad region according to an exemplary embodiment may include forming an insulation layer on a substrate, forming a pad electrode layer on the insulation layer, forming a photoresist pattern on the pad electrode layer in the pad region, etching the pad electrode layer and a portion of the insulation layer by the photoresist pattern as an etch-stop layer so as to simultaneously form a pad electrode and a side protection layer which covers a sidewall of the pad electrode, and stripping the photoresist pattern.

In an exemplary embodiment, the portion of the insulation layer may be etched by a first gas. The side protection layer may be provided by a combination of a material included in the portion of the insulation layer etched by the first gas and a material included in the photoresist pattern.

In an exemplary embodiment, the first gas may include chlorine, the portion of the insulation layer may include silicon, and the photoresist pattern may include oxygen.

In an exemplary embodiment, a taper angle between a bottom surface and a sidewall of the photoresist pattern may be in a range from about 60 degree to about 90 degree.

In an exemplary embodiment, the portion of the insulation layer may be etched by a second gas. The side protection layer may be provided by a combination of a material included in the portion of the insulation layer etched by the second gas and a material included in the second gas.

In an exemplary embodiment, the second gas may include fluorine and oxygen and the portion of the insulation layer may include silicon.

In an exemplary embodiment, the second gas may prevent the pad electrode from being corroded.

In an exemplary embodiment, the method may further include polishing the side protection layer by a chemical mechanical polishing ("CMP") method.

In an exemplary embodiment, the method may further include forming a pixel electrode layer on the substrate in the display region and the pad region, the pad electrode layer covering the pad electrode and the side protection layer and etching the pixel electrode layer by an etchant so as to form a pixel electrode in the display region.

In an exemplary embodiment, the pad electrode may include a main pad layer and an auxiliary pad layer covering a lower portion and an upper portion of the main pad layer. The main pad layer and the pixel electrode layer may include materials inducing a galvanic reaction in a presence of the etchant.

In order to achieve the object of the invention described above, in a method of manufacturing a backplane for a display device which includes a display region and a pad region according to an exemplary embodiment may include forming a pad electrode layer on a substrate, forming a photoresist pattern on the pad electrode layer in the pad region, etching the pad electrode layer by the photoresist pattern as an etch-stop layer so as to form a pad electrode, forming an insulation layer which is disposed on the substrate and covers the photoresist pattern and a sidewall of the pad electrode, and stripping the photoresist pattern and the insulation layer that covers the photoresist pattern so as to form a side protection layer which covers the sidewall of the pad electrode.

In an exemplary embodiment, the photoresist pattern and the insulation layer that covers the photoresist pattern may be stripped by a lift-off method.

In an exemplary embodiment, the pad electrode may be undercut in which a width, which is take along an extension direction of the substrate, of the pad electrode is less than a width of the photoresist pattern.

In order to achieve the object of the invention described above, a backplane for a display device which includes a display region and a pad region according to an exemplary embodiment may include an insulation layer disposed on a substrate, a pad electrode disposed on the insulation layer in the pad region, and a side protection layer covering a sidewall of the pad electrode.

In an exemplary embodiment, the side protection layer may only cover the sidewall of the pad electrode.

In an exemplary embodiment, the side protection layer may cover the sidewall of the pad electrode and a top surface of the insulation layer.

In an exemplary embodiment, the backplane may further include a drain electrode disposed on the insulation layer in the display region and a pixel electrode disposed on the drain electrode in the display region, the pixel electrode being electrically connected to the drain electrode.

In an exemplary embodiment, the pad electrode may include a main pad layer and an auxiliary pad layer covering a lower portion and an upper portion of the main pad layer. The main pad layer and the pixel electrode may include materials inducing a galvanic reaction in a presence of an electrolyte.

In an exemplary embodiment, the pad electrode may be disposed in substantially the same level as the drain electrode over the substrate and may include substantially the same material as the drain electrode.

In an exemplary embodiment, a height of the side protection layer may be substantially the same as a height, which is take along a direction perpendicular to an extension direction of the substrate, of the pad electrode.

In the method of manufacturing the backplane for the display device according to exemplary embodiments, the pad electrode layer and the portion of the first insulation layer may be etched so as to simultaneously form the pad electrode and the side protection layer, or the photoresist pattern may be stripped in company with the second insulation layer that covers the photoresist pattern. Thus, the side protection layer, which covers the sidewall of the pad electrode and prevents the pad electrode from being damaged, may be manufactured.

The backplane for the display device according to exemplary embodiments may include the side protection layer that covers the sidewall of the pad electrode, so that a damage of the pad electrode may be prevented.

BRIEF DESCRIPTION OF THE DRAWINGS

Illustrative, non-limiting exemplary embodiments will be more clearly understood from the following detailed description taken in conjunction with the accompanying drawings, in which.

DETAILED DESCRIPTION

Figure 1:
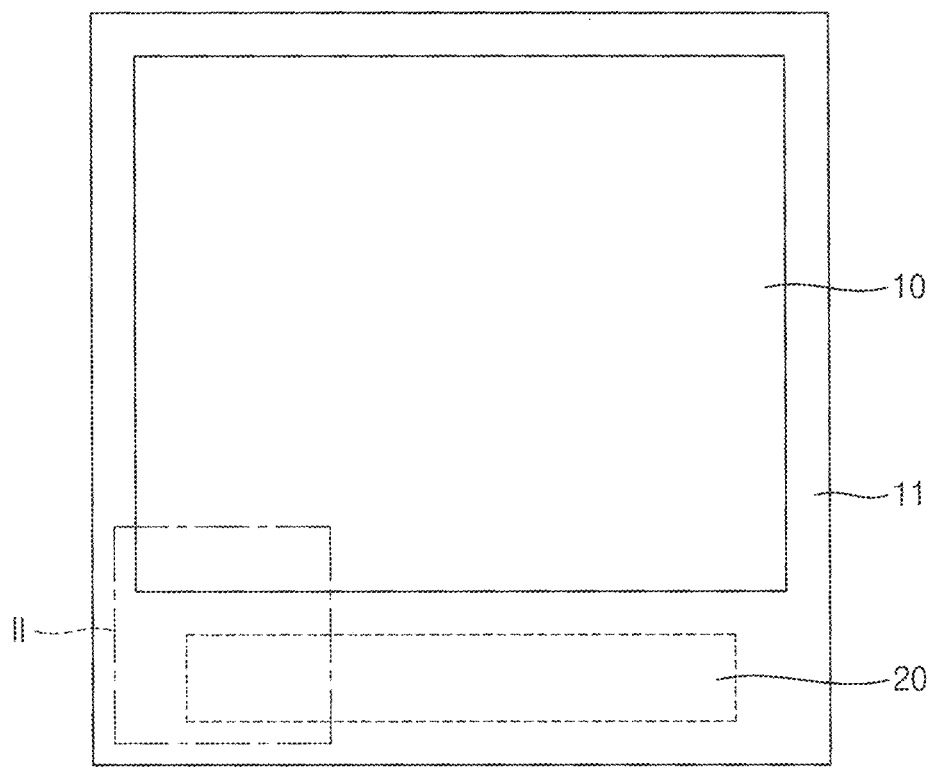
FIG. 1 is a plan view illustrating an exemplary embodiment of a backplane for a display device.

Hereinafter, backplanes for display devices and methods of manufacturing the backplanes for the display devices in accordance with exemplary embodiments of the invention will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
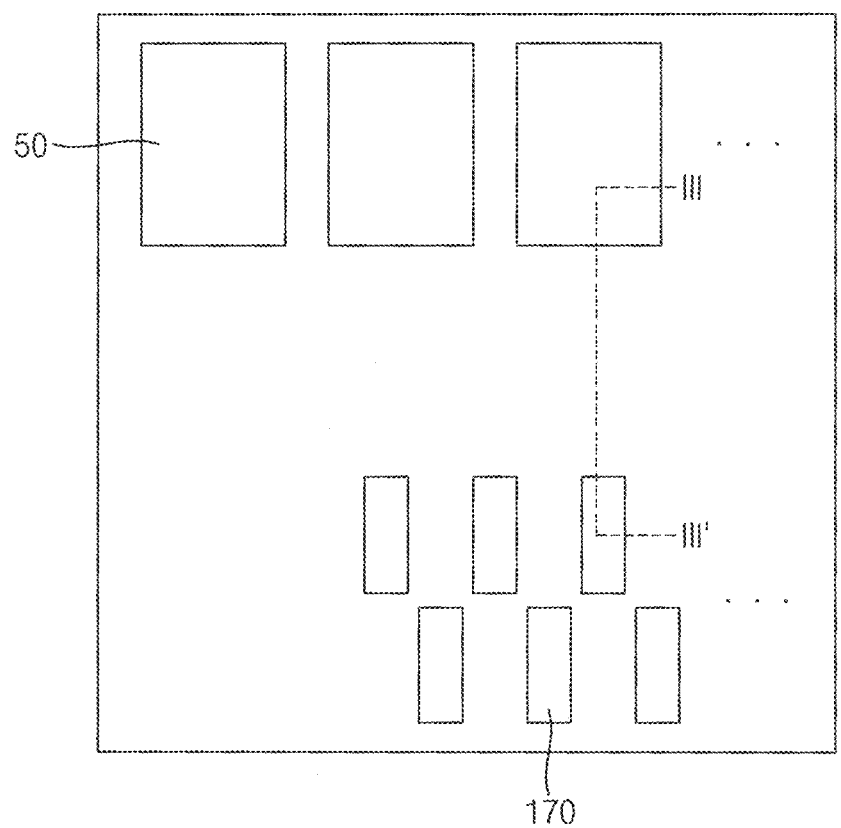
FIG. 2 is a plan view illustrating an exemplary embodiment of a backplane for a display device.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims FIG. 1 is a plan view illustrating a backplane for a display device according to an exemplary embodiment. FIG. 2 is a plan view illustrating a backplane for a display device according to an exemplary embodiment. FIG. 2 may be a plan view enlarging a region II in FIG. 1, for example.

Referring to FIGS. 1 and 2, a backplane for a display device according to an exemplary embodiment may include a display region 10 and a peripheral region 11. The peripheral region 11 may surround the display region 10. The peripheral region 11 may include a pad region 20.

A plurality of pixels 50 may be provided in the display region 10. The pixels 50 may be arranged as a matrix structure. However, the invention is not limited thereto, and the pixels 50 may be arranged as various other structures. The pixels 50 may be disposed between scan lines which transmit scan signals, data lines which transmit data signals, and driving voltage lines which transmit driving voltages. Each pixel 50 may include at least one transistor.

A plurality of pad electrodes 170 may be provided in the pad region 20. The pad electrodes 170 may be connected to the scan lines, the data lines, or the driving voltage lines so as to provide the scan signals, data signals, or the driving voltages.

Figure 3:
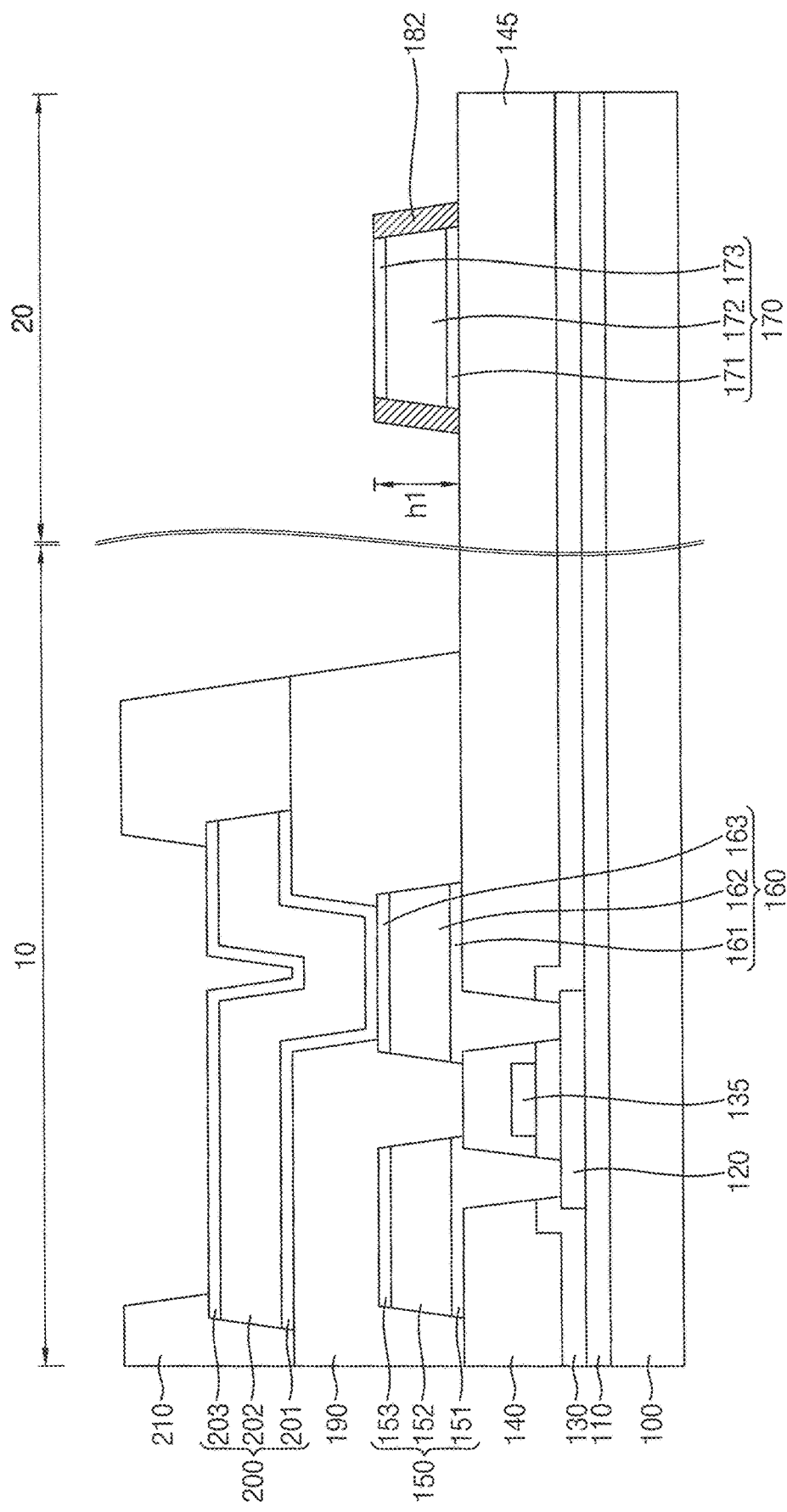
FIG. 3 is a cross-sectional view illustrating an exemplary embodiment of a backplane for a display device.

FIG. 3 is a cross-sectional view illustrating a backplane for a display device according to an exemplary embodiment. FIG. 3 may be a cross-sectional view cut along line III-III' in FIG. 2, for example.

Referring to FIG. 3, a backplane for a display device according to an exemplary embodiment may include a first insulation layer 145 disposed on a substrate 100, a pad electrode 170 disposed on the first insulation layer 145 in the pad region 20, and a side protection layer 182 covering a sidewall of the pad electrode 170.

A buffer layer 110 may be disposed on the substrate 100. The buffer layer 110 may extend from the display region 10 to the pad region 20. The buffer layer 110 may prevent a diffusion of impurities. The buffer layer 110 may control heat transfer rate in a crystallization process for the formation of an active pattern 120. The buffer layer 110 may improve a flatness of a surface of the substrate 100. In other exemplary embodiments, the buffer layer 110 may be omitted.

A thin film transistor ("TFT") may be disposed on the buffer layer 110. FIG. 3 illustrates one TFT. However, a plurality of TFTs may be disposed on the buffer layer 110. The TFT may include the active pattern 120, a gate electrode 135, a source electrode 150, and a drain electrode 160. The TFT may transmit a driving signal so as to drive the pixel.

The active pattern 120 may be disposed on the buffer layer 110. The active pattern 120 may be positioned in the display region 10.

The gate electrode 135 may be disposed over the active pattern 120. A gate insulation layer 130 may be disposed between the active pattern 120 and the gate electrode 135. The gate insulation layer 130 may insulate the gate electrode 135 from the active pattern 120. The gate electrode 135 may overlap a center portion of the active pattern 120. The gate insulation layer 130 may extend from the display region 10 to the pad region 20.

The source electrode 150 and the drain electrode 160 may be disposed over the gate electrode 135. An insulation interlayer 140 may be disposed between the gate electrode 135 and the source/drain electrodes 150/160.

The source electrode 150 and the drain electrode 160 may be electrically connected to the active pattern 120. In an exemplary embodiment, contact holes that expose opposing side portions of the active pattern 120 may be defined in the gate insulation layer 130 and the insulation interlayer 140, for example. The source electrode 150 and the drain electrode 160 may be in contact with the active pattern 120 through the contact holes.

In an exemplary embodiment, the source electrode 150 may include a first layer 151, a second layer 152, and a third layer 153, which are sequentially layered, and the drain electrode 160 may include a first layer 161, a second layer 162, and a third layer 163, which are sequentially layered. The second layers 152 and 162 of the source/drain electrodes 150/160 may serve as main electrode layers. The first layers 151 and 161 and the third layers 153 and 163 of the source/drain electrodes 150/160 may serve as auxiliary electrode layers that protect bottom surfaces and top surfaces of the second layers 152 and 162. In an exemplary embodiment, each of the source/drain electrodes 150/160 may be composed of triple layers including titanium (Ti)/ aluminum (Al)/titanium (Ti), for example.

The first insulation layer 145 may be disposed over the substrate 100. The first insulation layer 145 may be positioned in the pad region 20. In an exemplary embodiment, the first insulation layer 145 may be disposed in substantially the same level as the insulation interlayer 140 over the substrate 100. In an exemplary embodiment, the first insulation layer 145 may be a portion of the insulation interlayer 140, which extends from the display region 10 to the pad region 20.

In an exemplary embodiment, the first insulation layer 145 may include inorganic insulation material such as silicon compounds. In an exemplary embodiment, the first insulation layer 145 may include silicon nitride (SiNx), silicon oxide (SiOx), and/or silicon oxynitride (SiOxNy), for example.

The pad electrode 170 may be disposed on the first insulation layer 145. The pad electrode 170 may be positioned in the pad region 20. In an exemplary embodiment, the pad electrode 170 may be disposed in substantially the same level as the source/drain electrodes 150/160 over the substrate 100, and may include substantially the same material as the source/drain electrodes 150/160.

In an exemplary embodiment, the pad electrode 170 may include a main pad layer 172 and auxiliary pad layers 171 and 173, which respectively cover a lower portion and an upper portion of the main pad layer 172. The main pad layer 172 may serve as a main electrode layer. The auxiliary pad layers 171 and 173 may serve as auxiliary electrode layers that respectively protect a bottom surface and a top surface of the main pad layer 172. In an exemplary embodiment, the pad electrode 170 may be composed of triple layers including titanium (Ti)/aluminum (Al)/titanium (Ti), for example.

In an exemplary embodiment, the main pad layer 172 may include a material that induces galvanic reaction with a pixel electrode 200 in the presence of an electrolyte. Damages (e.g., corrosion) of the pad electrode 170 may occur when the galvanic reaction is induced.

The side protection layer 182 that covers a sidewall of the pad electrode 170 may be disposed on the first insulation layer 145. In an exemplary embodiment, the side protection layer 182 may cover an entirety of the sidewall of the main pad layer 172 of the pad electrode 170, for example. The side protection layer 182 may prevent the main pad layer 172 from being exposed in a side direction, and may protect the main pad layer 172. The auxiliary pad layers 171 and 173 may respectively cover the bottom surface and the top surface of the main pad layer 172, and the side protection layer 182 may cover the sidewall of the main pad layer 172. Therefore, damages of the pad electrode 170 may be prevented although the main pad layer 172 includes a material that induces galvanic reaction with the pixel electrode 200 in the presence of an electrolyte.

In an exemplary embodiment, the side protection layer 182 may include silicon oxide (SiOx), for example. In an exemplary embodiment, a height of the side protection layer 182 measured in a vertical direction substantially perpendicular to the extension direction of the substrate 100 may be substantially the same as a height h1 of the pad electrode 170.

In an exemplary embodiment, the side protection layer 182 may only cover the sidewall of the pad electrode 170. In an exemplary embodiment, the side protection layer 182 may be disposed on the sidewall of the pad electrode 170, and may not be disposed on a top surface of the pad electrode 170, for example.

The pixel electrode 200 may be disposed over the source/drain electrodes 150/160. A planarization layer 190 may be disposed between the source/drain electrodes 150/160 and the pixel electrode 200. The planarization layer 190 may insulate the pixel electrode 200 from the source electrode 150. The planarization layer 190 may be only disposed in the display region 10.

The pixel electrode 200 may be electrically connected to the drain electrode 160. In an exemplary embodiment, a via hole that exposes a portion of the drain electrode 160 may be provided in the planarization layer 190, for example. The pixel electrode 200 may be in contact with the drain electrode 160 through the via hole.

In an exemplary embodiment, the pixel electrode 200 may include a first layer 201, a second layer 202, and a third layer 203, which are sequentially layered. The second layer 202 of the pixel electrode 200 may serve as a main electrode layer. The first layer 201 and the third layer 203 of the pixel electrode 200 may serve as auxiliary electrode layers, which respectively protect a bottom surface and a top surface of the second layer 202. In an exemplary embodiment, the pixel electrode 200 may be composed of triple layers including indium-tin-oxide ("ITO")/silver (Ag)/indium-tin-oxide ("ITO"), for example.

In an exemplary embodiment, the main pad layer 172 of the pad electrode 170 and the second layer 202 of the pixel electrode 200 may include materials that induce galvanic reaction in the presence of an electrolyte. In an exemplary embodiment, the main pad layer 172 of the pad electrode 170 and the second layer 202 of the pixel electrode 200 may include aluminum (Al) and silver (Ag), respectively, which induce galvanic reaction in the presence of an electrolyte, for example.

A pixel defining layer 210 may be disposed on the planarization layer 190. The pixel defining layer 210 may partially cover the pixel electrode 200. The pixel defining layer 210 may cover a peripheral portion of the pixel electrode 200, and may expose a center portion of the pixel electrode 200. The pixel defining layer 210 may be only disposed in the display region 10.

The backplane according to an exemplary embodiment may be applied to various display devices. In an exemplary embodiment, the backplane according to an exemplary embodiment may be used as a backplane for an organic light emitting display device when an organic light emitting layer is disposed on the exposed pixel electrode 200. In another exemplary embodiment, the backplane according to an exemplary embodiment may be used as a backplane for a liquid crystal display device when a liquid crystal layer is disposed on the exposed pixel electrode 200. However, the applications of the backplane according to an exemplary embodiment are not limited thereto, and may be applied to various display devices.

FIGS. 4, 5, 6, 7, 8, and 9 are cross-sectional views illustrating a method of manufacturing a backplane for a display device according to an exemplary embodiment.

Figure 4:
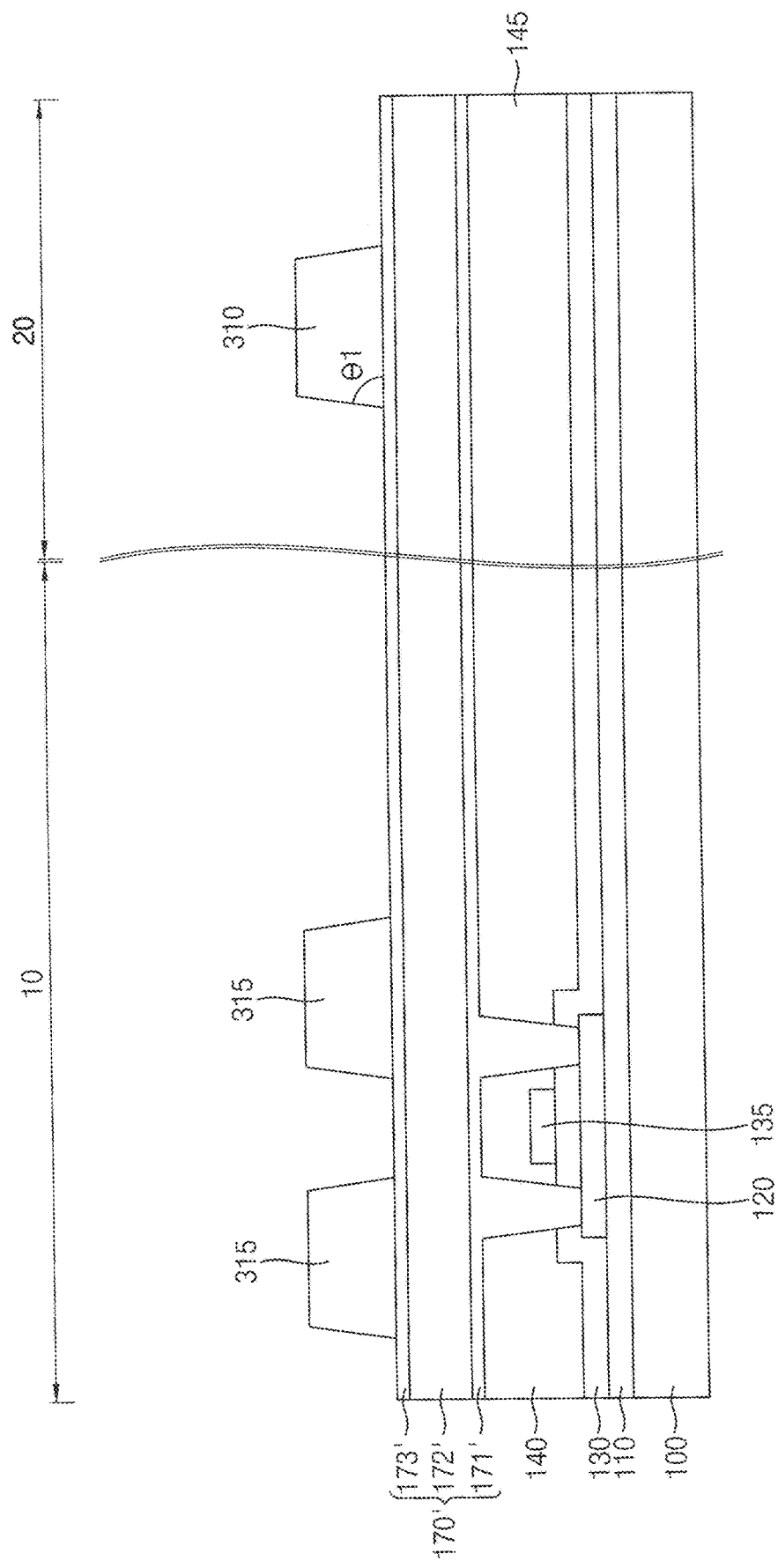
FIGS. 4, 5, 6, 7, 8, and 9 are cross-sectional views illustrating an exemplary embodiment of a method of manufacturing a backplane for a display device.

Referring to FIG. 4, the substrate 100 may include the display region 10 and the pad region 20. The first insulation layer 145 may be disposed on the substrate 100. The pad electrode layer 170' may be disposed on the first insulation layer 145. A photoresist pattern 310 may be disposed on the pad electrode layer 170' in the pad region 20.

The buffer layer 110 may be disposed on the substrate 100. The buffer layer 110 may extend from the display region 10 to the pad region 20. In an exemplary embodiment, the buffer layer 110 may include silicon oxide (SiOx), silicon nitride (SiNx), or the like, for example. In an exemplary embodiment, the buffer layer 110 may be provided by various deposition methods such as a plasma enhanced chemical vapor deposition ("PECVD"), an atmospheric pressure chemical vapor deposition ("APCVD"), a low pressure chemical vapor deposition ("LPCVD"), or the like. In some exemplary embodiments, the buffer layer 110 may not be provided.

The active pattern 120 may be disposed on the buffer layer 110 in the display region 10. In an exemplary embodiment, a semiconductor layer that includes a material including silicon, oxide semiconductor, or the like may be disposed on an entirety of a top surface of the buffer layer 110, and the semiconductor layer may be patterned so as to form the active pattern 120. When the active pattern 120 includes the material including silicon, an amorphous silicon layer may be disposed on the buffer layer 110, and the amorphous silicon layer may be crystallized so as to form a polycrystalline silicon layer. After patterning the polycrystalline silicon layer, impurities may be doped at opposing side portions of the patterned polycrystalline silicon layer so as to form the active pattern 120, which includes a source region, a drain region, and a channel region disposed therebetween.

The gate insulation layer 130 may be disposed on the buffer layer 110, and may cover the active pattern 120. The gate insulation layer 130 may extend from the display region 10 to the pad region 20. In an exemplary embodiment, the gate insulation layer 130 may include silicon oxide (SiOx), silicon nitride (SiNx), or the like, for example.

The gate electrode 135 may be disposed on the gate insulation layer 130 in the display region 10. The gate electrode 135 may overlap the active pattern 120. In an exemplary embodiment, the gate electrode 135 may include a metal, an alloy thereof, a nitride thereof, a conductive oxide thereof, a transparent conductive oxide, or the like, for example.

The insulation interlayer 140 may be disposed on the gate insulation layer 130, and may cover the gate electrode 135. In an exemplary embodiment, the insulation interlayer 140 may include silicon oxide (SiOx), silicon nitride (SiNx), or the like, for example.

The first insulation layer 145 may be provided over the substrate 100 in the pad region 20. In an exemplary embodiment, the first insulation layer 145 may include silicon oxide (SiOx), silicon nitride (SiNx), or the like, for example. In an exemplary embodiment, the first insulation layer 145 may be a portion of the insulation interlayer 140, which extends from the display region 10 to the pad region 20.

The contact holes exposing portions of the active pattern 120 may be defined in the gate insulation layer 130 and the insulation interlayer 140. In an exemplary embodiment, the contact holes may expose opposing side portions of the active pattern 120, for example.

The pad electrode layer 170' may be disposed on the first insulation layer 145. In an exemplary embodiment, the pad electrode layer 170' may be disposed on the insulation interlayer 140 that includes the first insulation layer 145 as a portion, and may be in contact with the active pattern 120 through the contact holes. In an exemplary embodiment, a first electrode sub-layer 171', a second electrode sub-layer 172', and a third electrode sub-layer 173' may be sequentially disposed on the insulation interlayer 140. The first, second, and third electrode sub-layers 171', 172', and 173' may extend from the display region 10 to the pad region 20. In an exemplary embodiment, the first, second, and third electrode sub-layers 171', 172', and 173' may include titanium (Ti), aluminum (Al), and titanium (Ti), respectively, for example.

The photoresist pattern 310 may be disposed on the pad electrode layer 170' in the pad region 20. In an exemplary embodiment, a photoresist layer may be disposed on the pad electrode layer 170', and the photoresist layer may be exposed and developed by a mask, for example. Thus, photoresist patterns 310 and 315 corresponding to the source electrode 150, the drain electrode 160, and the pad electrode 170 may be provided.

Figure 5:
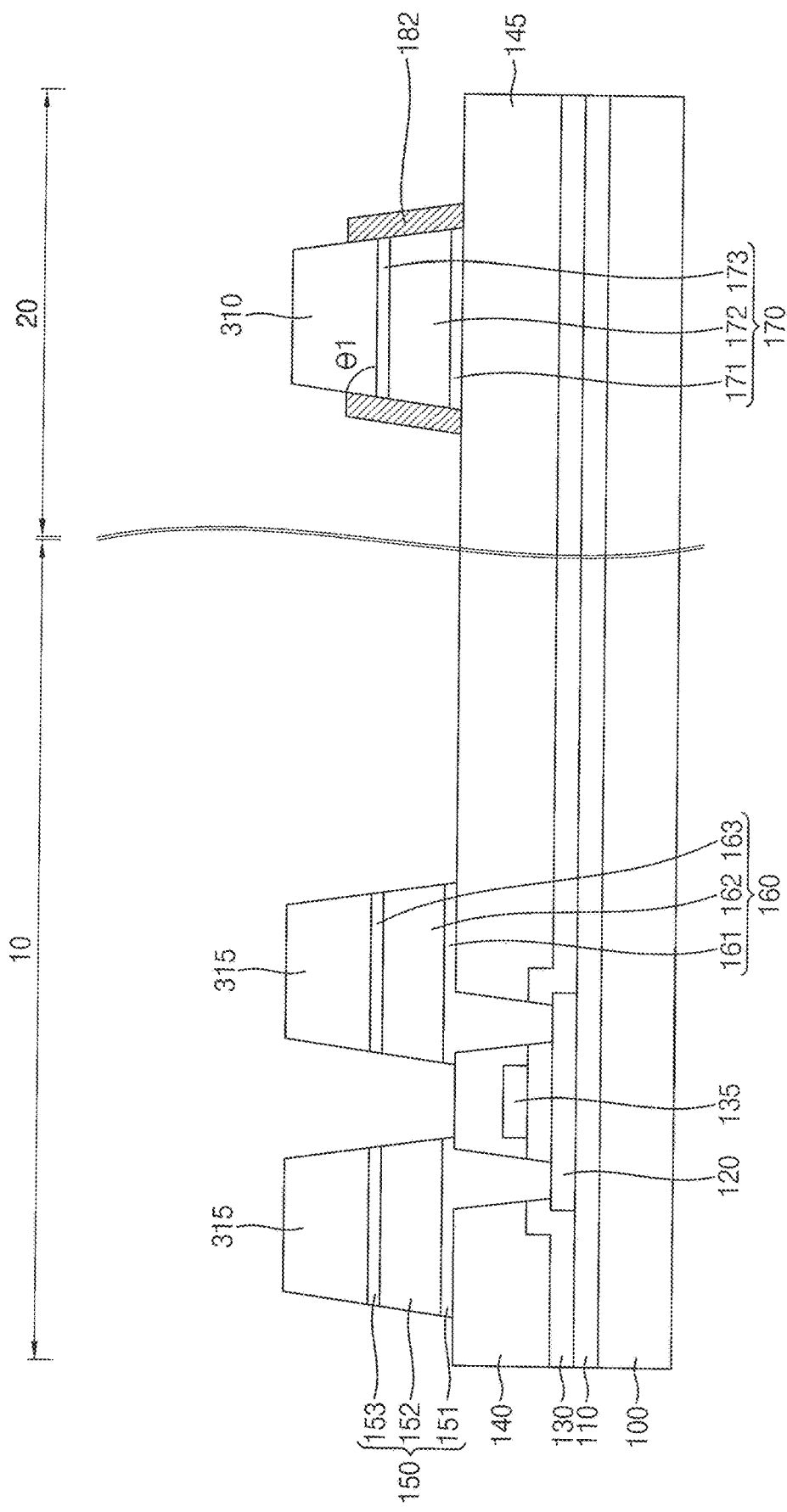

Referring to FIG. 5, the pad electrode layer 170' and a portion of the first insulation layer 145 may be etched by the photoresist pattern 310 as an etch-stop layer so as to substantially simultaneously form the pad electrode 170 and the side protection layer 182 that covers the sidewall of the pad electrode 170.

In an exemplary embodiment, the pad electrode layer 170' may be etched by a dry etching method using an etching gas so as to form the pad electrode 170. In an exemplary embodiment, the first, second, and third electrode sub-layers 171', 172', and 173' may be etched by the dry etching method so as to form the pad electrode 170 including the main pad layer 172 and the auxiliary pad layers 171 and 173 covering the lower portion and the upper portion of the main pad layer 172, for example. In an exemplary embodiment, the pad electrode 170 may be composed of triple layers including titanium (Ti)/aluminum (Al)/titanium (Ti), for example.

In exemplary embodiments, the portion of the first insulation layer 145 may be etched by a first gas, and the side protection layer 182 may be provided by a combination of a material included in the portion of the first insulation layer 145 etched by the first gas, and a material included in the photoresist pattern 310. In an exemplary embodiment, the first gas may function as an etching gas that etches the pad electrode layer 170' and the portion of the first insulation layer 145.

In an exemplary embodiment, the first gas may include chlorine (Cl), the portion of the first insulation layer 145 may include silicon (Si), and the photoresist pattern 310 may include oxygen (O), for example. In an exemplary embodiment, the first gas may include $BCl_3$ and/or $Cl_2$, and the first insulation layer 145 may include silicon nitride (SiNx), silicon oxide (SiOx), and/or silicon oxynitride (SiOxNy), for example. In this case, the side protection layer 182 including silicon oxide (SiOx) may be provided. In an exemplary embodiment, silicon (Si) emitted from the first insulation layer 145 etched by chlorine (Cl) included in the first gas, and oxygen (O) emitted from the photoresist pattern 310 may be combined so as to form the side protection layer 182 including silicon oxide (SiOx) on the sidewall of the pad electrode 170, for example.

In an exemplary embodiment, a taper angle ($\Theta 1$) between a bottom surface and a sidewall of the photoresist pattern 310 may be in a range from about 60 degree to about 90 degree, for example. The side protection layer 182 may not be provided when the taper angle ($\Theta 1$) is less than about 60 degree, for example. The pad electrode layer 170' may be irregularly etched when the taper angle ($\Theta 1$) is greater than about 90 degree, for example.

In some exemplary embodiments, the portion of the first insulation layer 145 may be etched by a second gas, and the side protection layer 182 may be provided by a combination of a material included in the portion of the first insulation layer 145 etched by the second gas, and a material included in the second gas. In an exemplary embodiment, the second gas may prevent the pad electrode 170 from being corroded. Accordingly, a corrosion of the pad electrode 170 may be prevented when the photoresist pattern 310 is stripped.

In an exemplary embodiment, the second gas may include fluorine (F) and oxygen (O), and the portion of the first insulation layer 145 may include silicon (Si). In an exemplary embodiment, the second gas may include $CF_4$ and $O_2$, and the first insulation layer 145 may include silicon nitride (SiNx), silicon oxide (SiOx), and/or silicon oxynitride (SiOxNy), for example. In this case, the side protection layer 182 including silicon oxide (SiOx) may be provided. In an exemplary embodiment, silicon (Si) emitted from the first insulation layer 145 etched by fluorine (F) included in the second gas, and oxygen (O) emitted from the second gas may be combined so as to form the side protection layer 182 including silicon oxide (SiOx) on the sidewall of the pad electrode 170, for example.

In an exemplary embodiment, the pad electrode layer 170' may be etched by the photoresist patterns 315 as etch-stop layers so as to form the source electrode 150 and the drain electrode 160. In an exemplary embodiment, the pad electrode layer 170' may be etched by the photoresist patterns 310 and 315 so as to substantially simultaneously form the source electrode 150, the drain electrode 160, and the pad electrode 170, for example.

Figure 6:
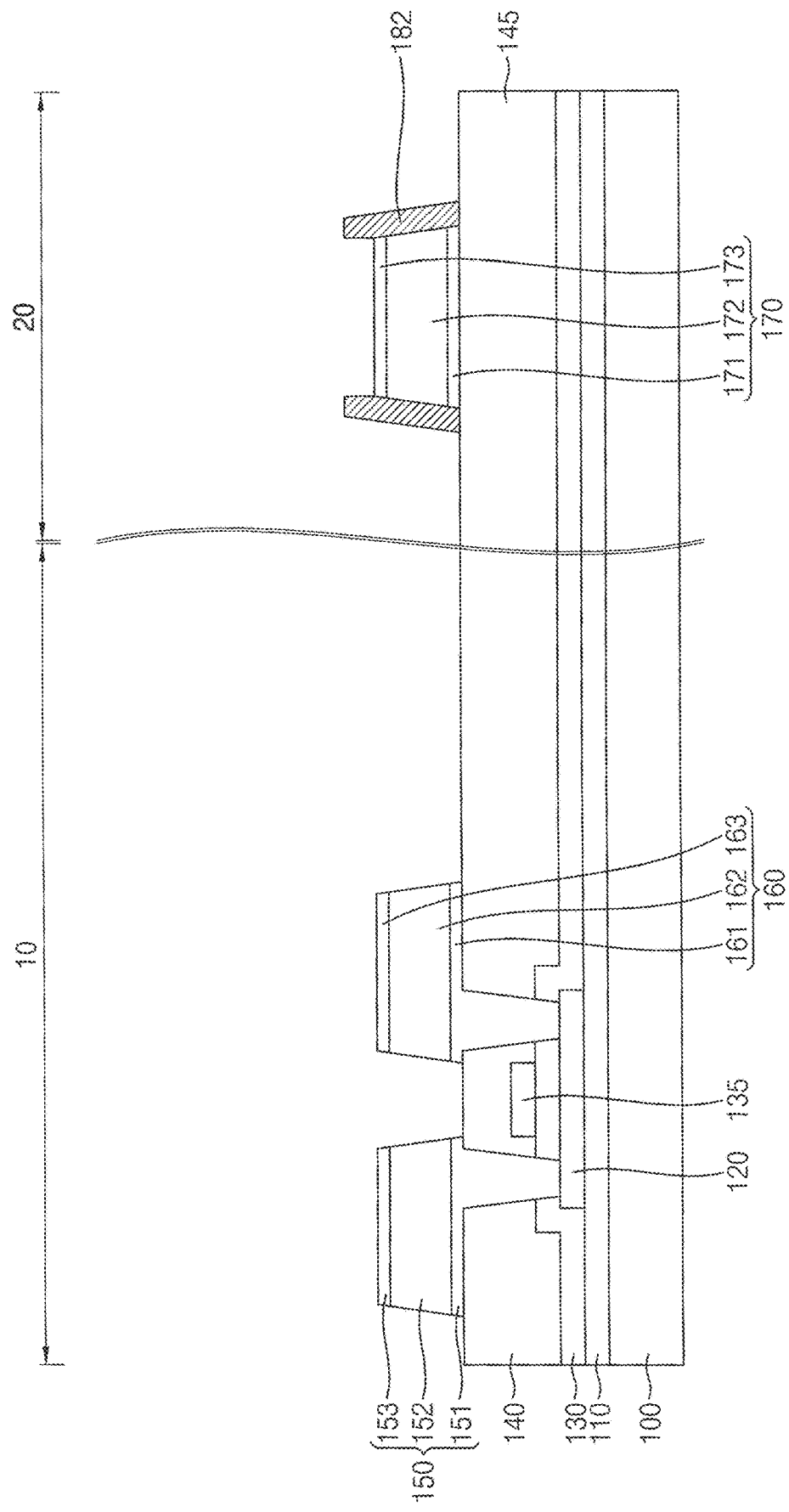

Referring to FIG. 6, the photoresist pattern 310 may be stripped. In an exemplary embodiment, the photoresist pattern 310 may be stripped from the pad electrode 170 by photoresist stripping liquid, for example. In an exemplary embodiment, the photoresist patterns 310 and 315 disposed on the source electrode 150, the drain electrode 160, and the pad electrode 170 may be substantially simultaneously stripped.

Figure 7:
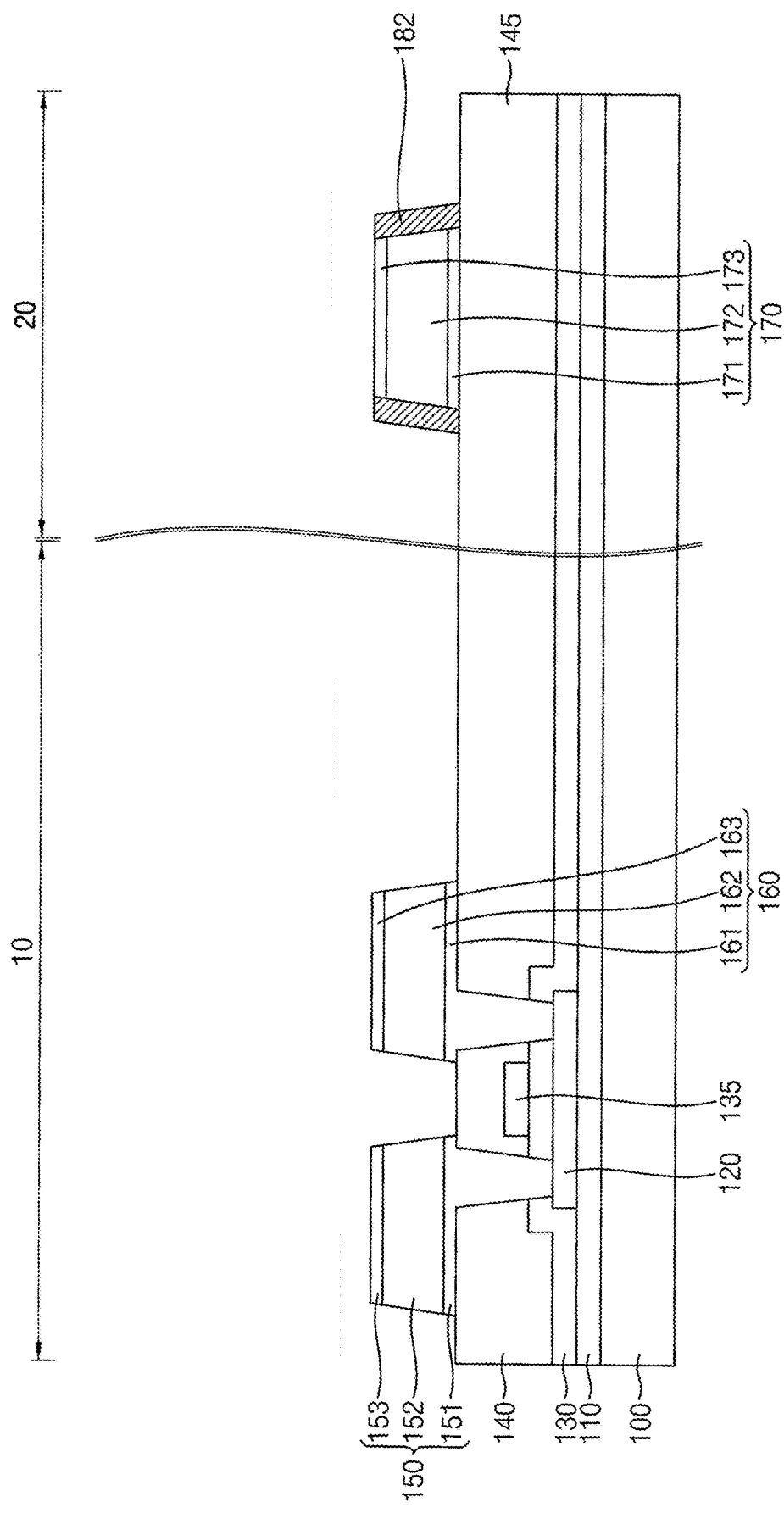

Referring to FIG. 7, the side protection layer 182 may be polished by a chemical mechanical polishing ("CMP") method.

In an exemplary embodiment, a top surface of the side protection layer 182 may be higher than a top surface of the pad electrode 170. In this case, an upper portion of the side protection layer 182 may be polished in order to remove a portion of the side protection layer 182 that is positioned higher than the top surface of the pad electrode 170. By polishing the side protection layer 182, the top surface of the side protection layer 182 may be positioned substantially the same as the top surface of the pad electrode 170.

Figure 8:
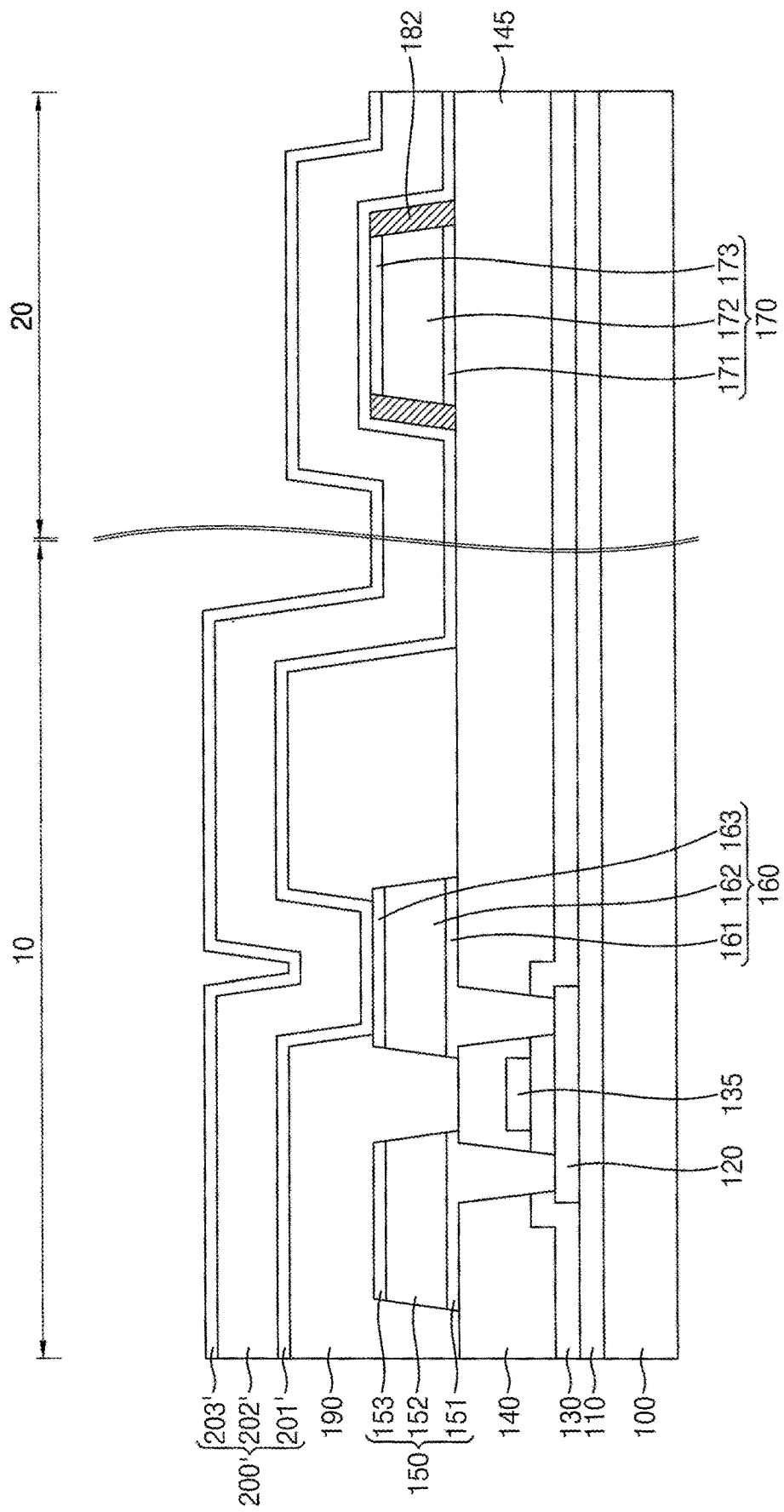

Referring to FIG. 8, a pixel electrode layer 200' may be disposed on the substrate 100 in the display region 10 and the pad region 20. The pixel electrode layer 200' may cover the pad electrode 170 and the side protection layer 182.

The planarization layer 190 may be disposed on the insulation interlayer 140 in the display region 10. The planarization layer 190 may cover the source electrode 150 and the drain electrode 160. The via hole may be provided in the planarization layer 190. The via hole may expose a portion of the drain electrode 160. In an exemplary embodiment, the via hole may expose a top surface of the drain electrode 160, for example. The planarization layer 190 may include organic material. In an exemplary embodiment, the planarization layer 190 may include polyimide-based resin, photoresist, acrylic-based resin, polyamide-based resin, and/or siloxane-based resin, for example.

The planarization layer 190 may be only provided in the display region 10. The planarization layer 190 may not extend to the pad region 20. Moisture flowed in from outside may be transmitted from the pad region 20 to the display region 10 through the planarization layer 190 when the planarization layer 190 extends to the pad region 20. The moisture may degrade a pixel. Therefore, the planarization layer 190 may not be disposed in the pad region 20 so as to prevent a degradation of the pixel.

The pixel electrode layer 200' may be disposed on the planarization layer 190 and the first insulation layer 145. The pixel electrode layer 200' may extend from the display region 10 to the pad region 20. The pixel electrode layer 200' may be in contact with the drain electrode 160, which is exposed by the via hole in the planarization layer 190. The pixel electrode layer 200' may cover the pad electrode 170 and the side protection layer 182. Specifically, the pixel electrode layer 200' may cover a top surface of the pad electrode 170 and a top surface and a sidewall of the side protection layer 182. In an exemplary embodiment, the pixel electrode layer 200' may be provided by sputtering, chemical vapor deposition ("CVD"), physical vapor deposition ("PVD"), or the like, for example.

In an exemplary embodiment, a first layer 201', a second layer 202', and a third layer 203' may be sequentially layered so as to form the pixel electrode layer 200'. In an exemplary embodiment, the first layer 201' and the third layer 203' may include ITO, and the second layer 202' may include silver (Ag), for example.

Figure 9:
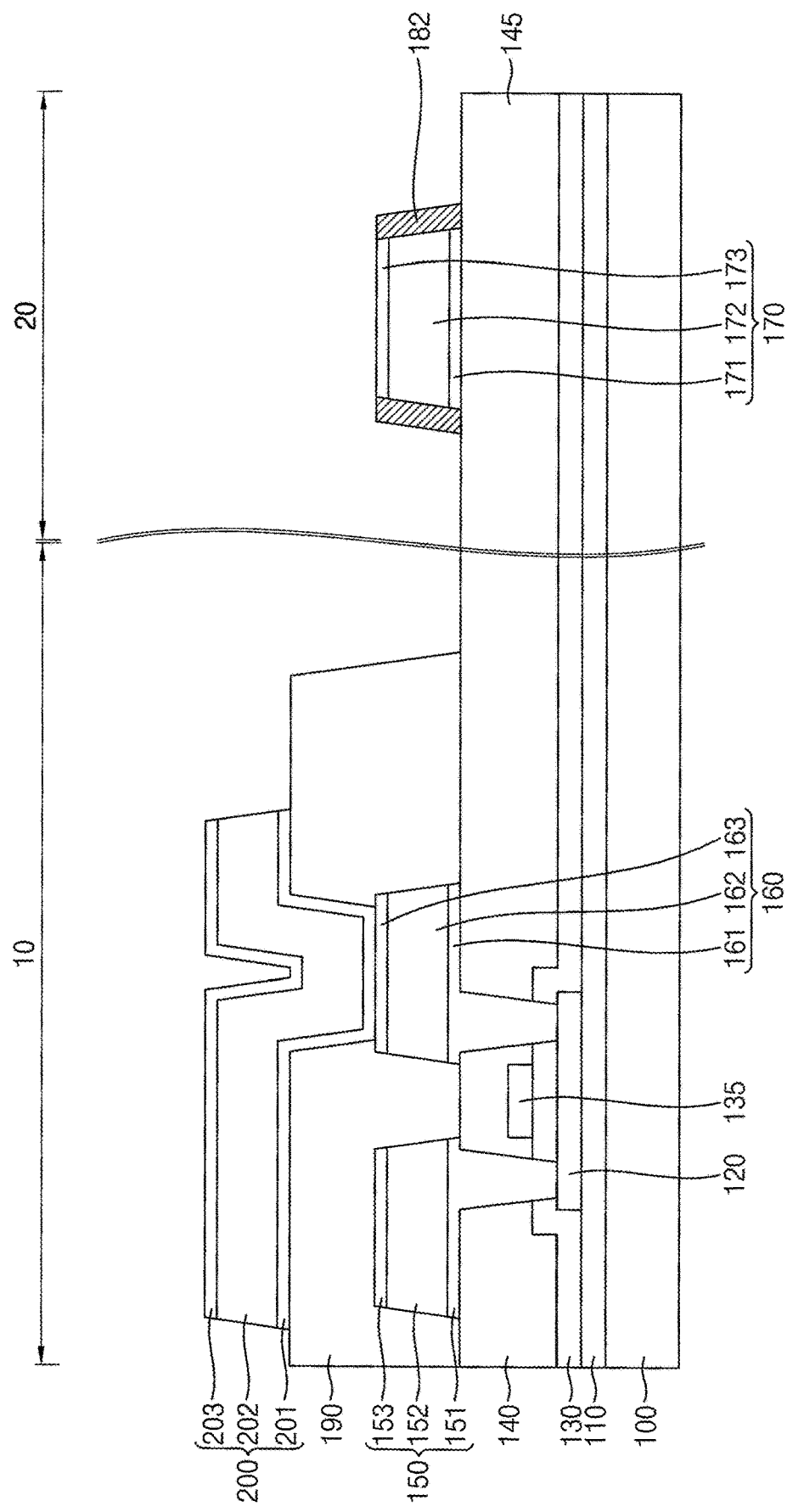

Referring to FIG. 9, the pixel electrode layer 200' (refer to FIG. 8) may be etched by an etchant so as to form the pixel electrode 200 in the display region 10.

A photoresist pattern may be disposed on the pixel electrode layer 200'. The photoresist pattern may correspond to a region at which the pixel electrode 200 is provided. In an exemplary embodiment, a photoresist layer that extends from the display region 10 to the pad region 20 may be disposed on the pixel electrode layer 200', for example. The photoresist layer may be exposed and developed by a mask so as to form the photoresist pattern. Then, the pixel electrode layer 200' may be etched by the photoresist pattern as an etch-stop layer so as to form the pixel electrode 200. In an exemplary embodiment, the pixel electrode layer 200' may be etched by a wet etching method using an etchant, for example.

In an exemplary embodiment, the main pad layer 172 of the pad electrode 170 and the pixel electrode layer 200' may include materials that induce galvanic reaction in the presence of the etchant. In an exemplary embodiment, the main pad layer 172 and the second layer 202' of the pixel electrode layer 200' may include aluminum (Al) and silver (Ag), respectively, which induce galvanic reaction in the presence of the etchant, for example. The galvanic reaction is an electrochemical process in which a metal ion is reduced based on oxidation-reduction reaction when two metals having different standard reduction potentials are connected by an electrolyte.

Silver ion (Ag+) may be generated by phosphoric acid ($H_3PO_4$) included in the etchant when silver (Ag) included in the second layer 202' of the pixel electrode layer 200' contacts the etchant, which is an electrolyte. When the silver ion (Ag+) contacts aluminum (Al) included in the main pad layer 172, the silver ion (Ag+) may be reduced based on oxidation-reduction reaction so as to generate silver (Ag) particle, and aluminum (Al) may be oxidized.

According to a conventional method of manufacturing a backplane for a display device, a main pad layer of a pad electrode may be corroded based on the oxidation-reduction reaction between silver ion (Ag+) and aluminum (Al). Therefore, conductive paths may include silver (Ag) particles between pad electrodes, and the pad electrodes may be short-circuited. In order to prevent corrosions or short-circuit of the pad electrodes, the side protection layer 182 covering the sidewall of the pad electrode 170 may be provided in a method of manufacturing the backplane for the display device according to an exemplary embodiment. The auxiliary pad layers 171 and 173 may respectively cover the bottom surface and the top surface of the main pad layer 172, and the side protection layer 182 may cover the sidewall of the main pad layer 172. Thus, the main pad layer 172 may not be exposed to a material generated when the pixel electrode layer 200' is wet-etched, and a damage of the pad electrode 170 may be prevented.

Referring back to FIG. 3, the pixel defining layer 210 may be disposed on the planarization layer 190 in the display region 10. The pixel defining layer 210 may cover the pixel electrode 200.

An opening portion may be provided in the pixel defining layer 210. The opening portion may expose a portion of the pixel electrode 200. In an exemplary embodiment, the opening portion may expose a center portion of the pixel electrode 200, for example. The pixel defining layer 210 may include organic material. In an exemplary embodiment, the pixel defining layer 210 may include polyimide-based resin, photoresist, acrylic-based resin, polyamide-based resin, and/or siloxane-based resin, for example.

Figure 10:
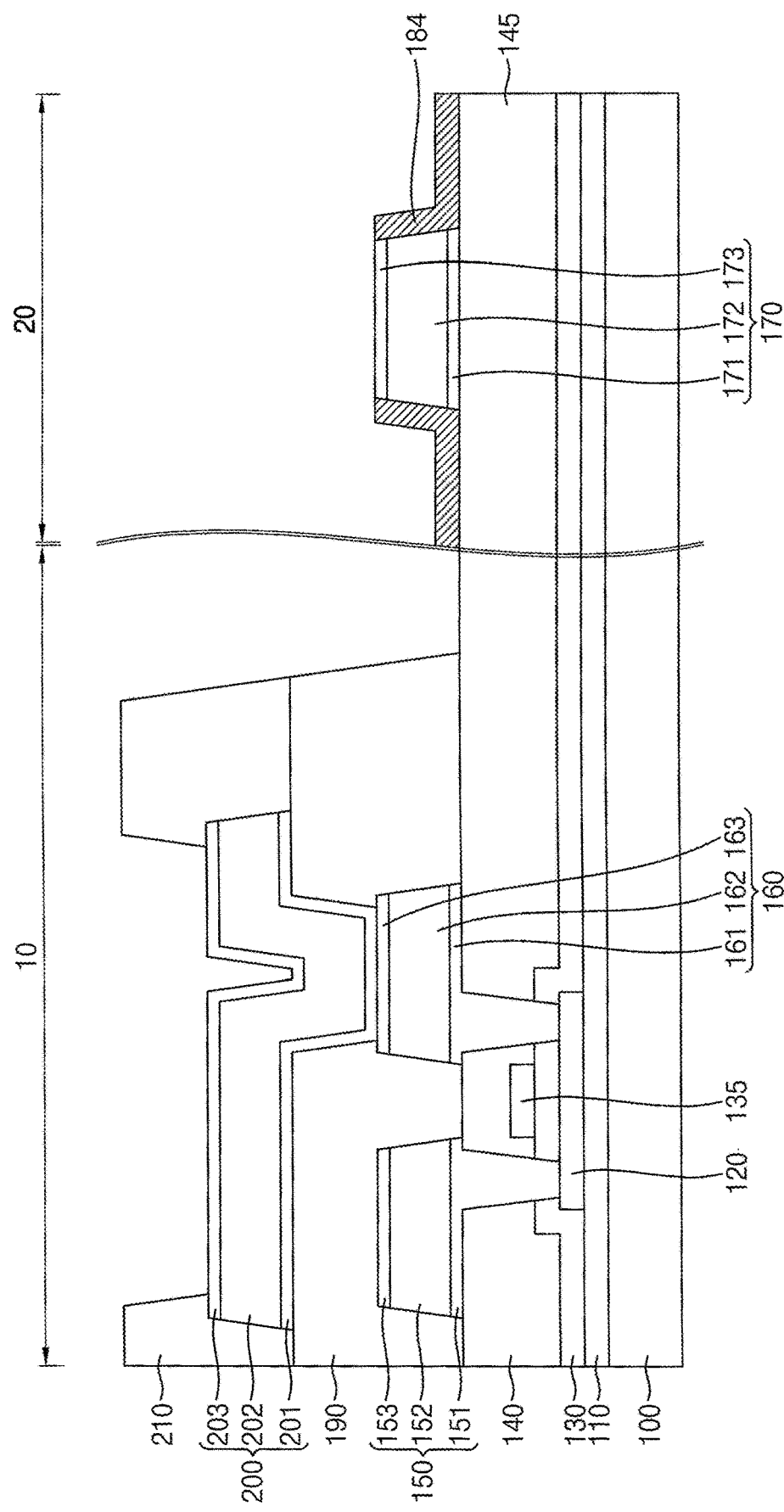
FIG. 10 is a cross-sectional view illustrating another exemplary embodiment of a backplane for a display device.

FIG. 10 is a cross-sectional view illustrating a backplane for a display device according to another exemplary embodiment. FIG. 10 may be a cross-sectional view cut along line III-III' in FIG. 2, for example.

Referring to FIG. 10, a backplane for a display device according to another exemplary embodiment may include a first insulation layer 145 disposed on a substrate 100, a pad electrode 170 disposed on the first insulation layer 145 in the pad region 20, and a side protection layer 184 covering a sidewall of the pad electrode 170.

A backplane for a display device illustrated in FIG. 10 may have elements and/or structures substantially the same as or similar to the backplane for the display device illustrated in FIG. 3. Accordingly, detailed descriptions on the same elements and/or structures will not be repeated.

The side protection layer 184 that covers the sidewall of the pad electrode 170 may be disposed on the first insulation layer 145. In an exemplary embodiment, the side protection layer 184 may cover an entirety of the sidewall of the main pad layer 172 of the pad electrode 170, for example. The side protection layer 184 may prevent the main pad layer 172 from being exposed in a side direction, and may protect the main pad layer 172. The auxiliary pad layers 171 and 173 may respectively cover the bottom surface and the top surface of the main pad layer 172, and the side protection layer 184 may cover the sidewall of the main pad layer 172. Therefore, damages of the pad electrode 170 may be prevented although the main pad layer 172 includes a material that induces galvanic reaction with the pixel electrode 200 in the presence of an electrolyte.

The side protection layer 184 may include inorganic insulation material such as silicon compounds. In an exemplary embodiment, the side protection layer 184 may include silicon nitride (SiNx), silicon oxide (SiOx), and/or silicon oxynitride (SiOxNy), for example. In an exemplary embodiment, a height of the side protection layer 184 may be substantially the same as a height of the pad electrode 170.

In an exemplary embodiment, the side protection layer 184 may cover the sidewall of the pad electrode 170 and a top surface of the first insulation layer 145. In an exemplary embodiment, the side protection layer 184 may cover an entirety of a surface of the first insulation layer 145 in the pad region 20 except for a top surface of the pad electrode 170, for example.

FIGS. 11, 12, 13, 14, 15, and 16 are cross-sectional views illustrating a method of manufacturing a backplane for a display device according to another exemplary embodiment.

A method of manufacturing a backplane for a display device illustrated in FIGS. 11 through 16 may have elements and/or steps substantially the same as or similar to the method of manufacturing the backplane for the display device illustrated in FIGS. 4 through 9. Accordingly, detailed descriptions on the same elements and/or steps will not be repeated.

Figure 11:
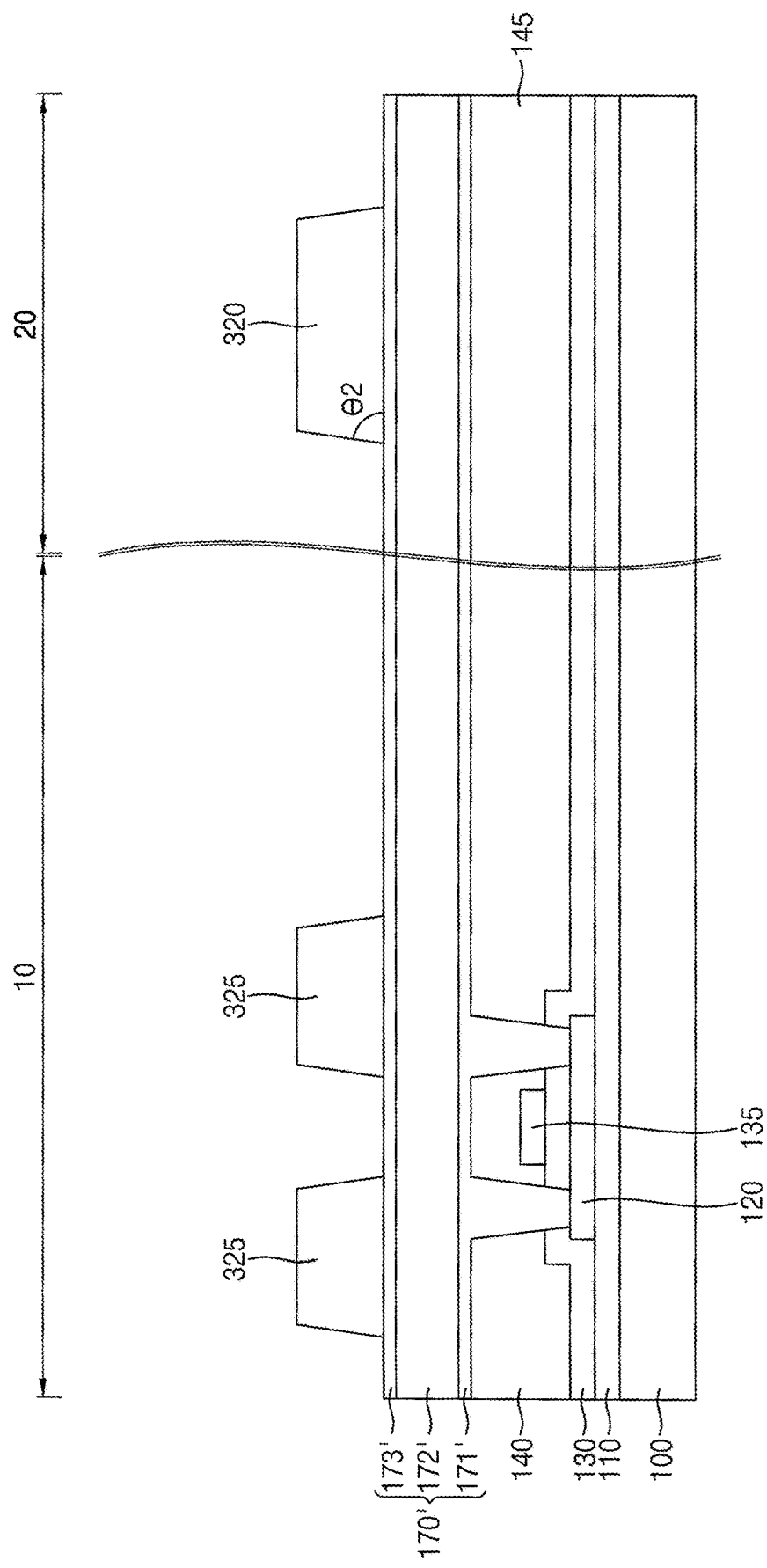
FIGS. 11, 12, 13, 14, 15, and 16 are cross-sectional views illustrating another exemplary embodiment of a method of manufacturing a backplane for a display device.

Referring to FIG. 11, the substrate 100 may include the display region 10 and the pad region 20. The pad electrode layer 170' may be disposed on the substrate 100. A photoresist pattern 320 may be disposed on the pad electrode layer 170' in the pad region 20.

The photoresist pattern 320 may be disposed on the pad electrode layer 170' in the pad region 20. In an exemplary embodiment, a photoresist layer may be disposed on the pad electrode layer 170', and the photoresist layer may be exposed and developed by a mask, for example. Thus, photoresist patterns 320 and 325 corresponding to the source electrode 150, the drain electrode 160, and the pad electrode 170 (refer to FIG. 12) may be provided.

Figure 12:
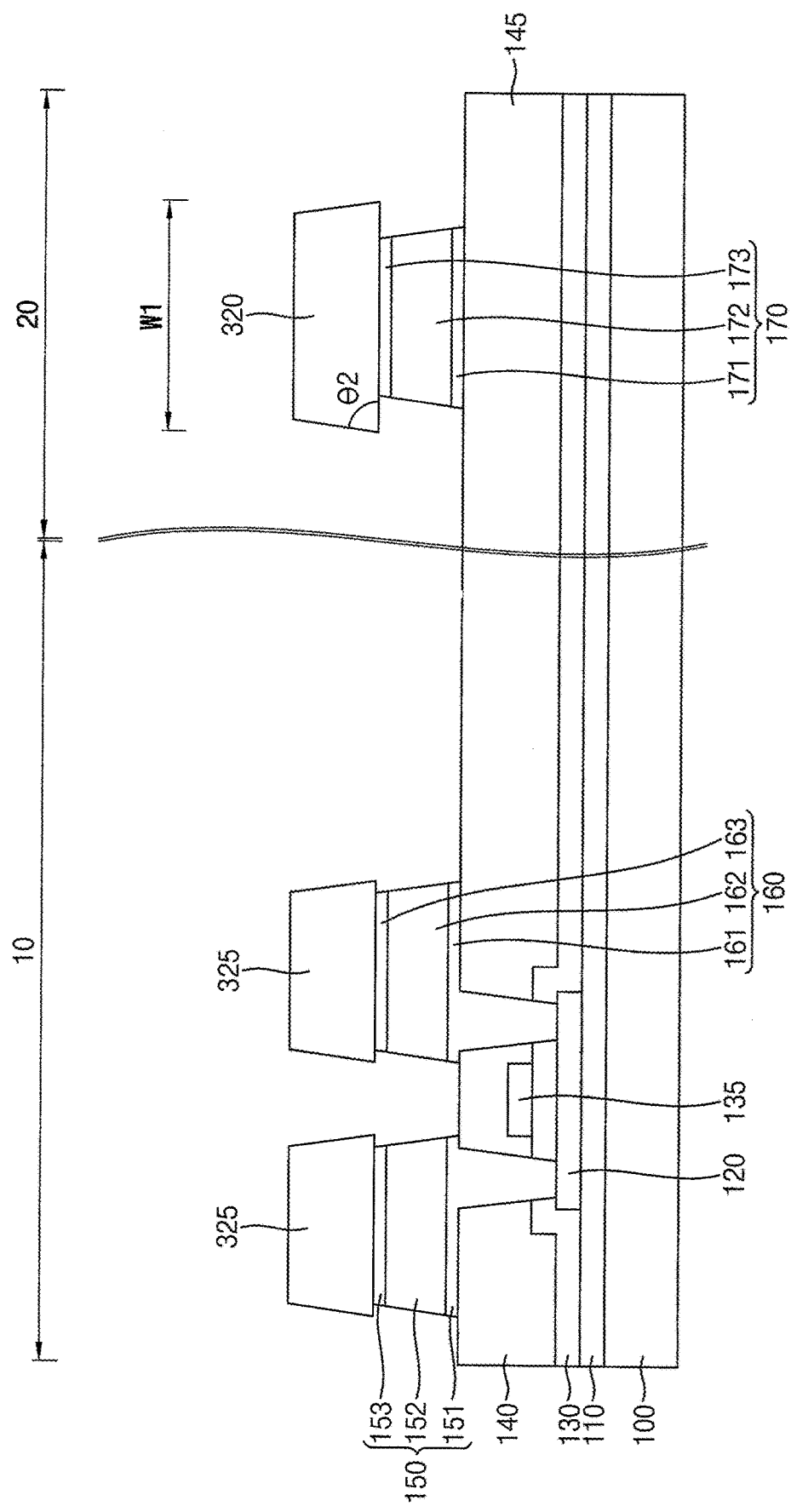

Referring to FIG. 12, the pad electrode layer 170' (refer to FIG. 11) may be etched by the photoresist pattern 320 as an etch-stop layer so as to form the pad electrode 170.

In an exemplary embodiment, the pad electrode 170 may be undercut in which a width of the pad electrode 170 taken along a horizontal direction may be less than a width W1 of the photoresist pattern 320. In an exemplary embodiment, the pad electrode 170 may be etched such that a sidewall of the pad electrode 170 may be disposed inside a sidewall of the photoresist pattern 320, for example. Accordingly, a width of a top surface of the pad electrode 170 may be less than a width of a bottom surface of the photoresist pattern 320. The photoresist pattern 320 may be more easily stripped when the width of the top surface of the pad electrode 170 is less than the width of the bottom surface of the photoresist pattern 320.

Figure 13:
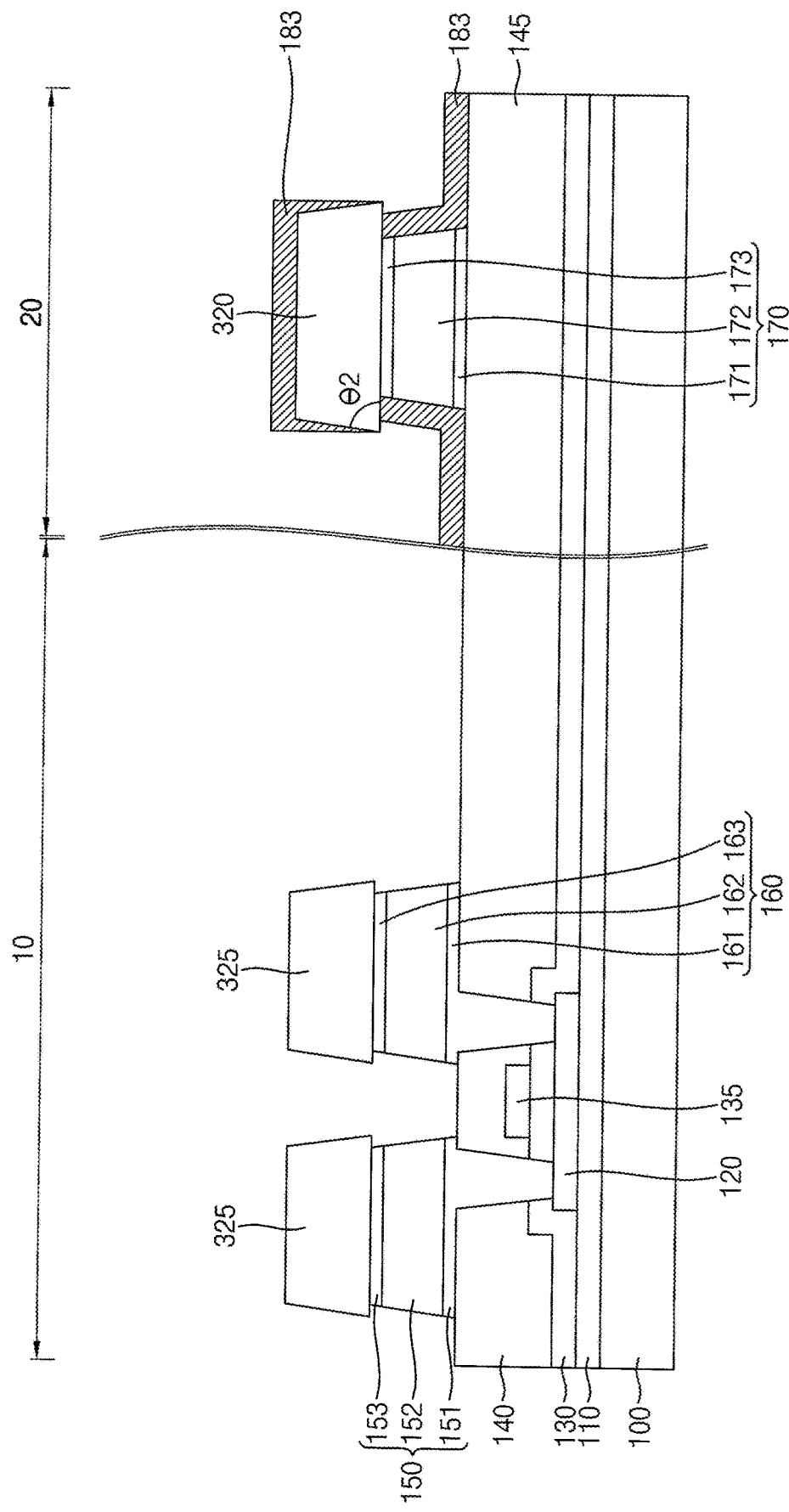

Referring to FIG. 13, a second insulation layer 183 may be disposed on the substrate 100. The second insulation layer 183 may cover the photoresist pattern 320 and the sidewall of the pad electrode 170.

In an exemplary embodiment, the second insulation layer 183 may cover a top surface of the first insulation layer 145, the sidewall of the pad electrode 170, and a top surface of the photoresist pattern 320, and may not cover a sidewall of the photoresist pattern 320. In the illustrated exemplary embodiment, the second insulation layer 183 may cover the top surface of the first insulation layer 145, the sidewall of the pad electrode 170, and the top surface and the sidewall of the photoresist pattern 320. In this case, a width, which is taken along a horizontal direction, of the second insulation layer 183 that covers the sidewall of the photoresist pattern 320 may be less than a thickness, which is taken along a vertical direction, of the second insulation layer 183 that covers the top surface of the first insulation layer 145, the sidewall of the pad electrode 170, and the top surface of the photoresist pattern 320.

The width of the second insulation layer 183 that covers the sidewall of the photoresist pattern 320 may decrease along a vertical direction or the second insulation layer 183 may not be disposed on the sidewall of the photoresist pattern 320 as a taper angle ($\Theta 2$) between a bottom surface and a sidewall of the photoresist pattern 320 increases. The photoresist pattern 320 may be more easily stripped as the thickness of the second insulation layer 183 that covers the sidewall of the photoresist pattern 320 decreases. In an exemplary embodiment, the second insulation layer 183 may not be disposed on the sidewall of the photoresist pattern 320 or the thickness of the second insulation layer 183 may be relatively small when the taper angle ($\Theta 2$) is close to about 90 degree, for example.

Figure 14:
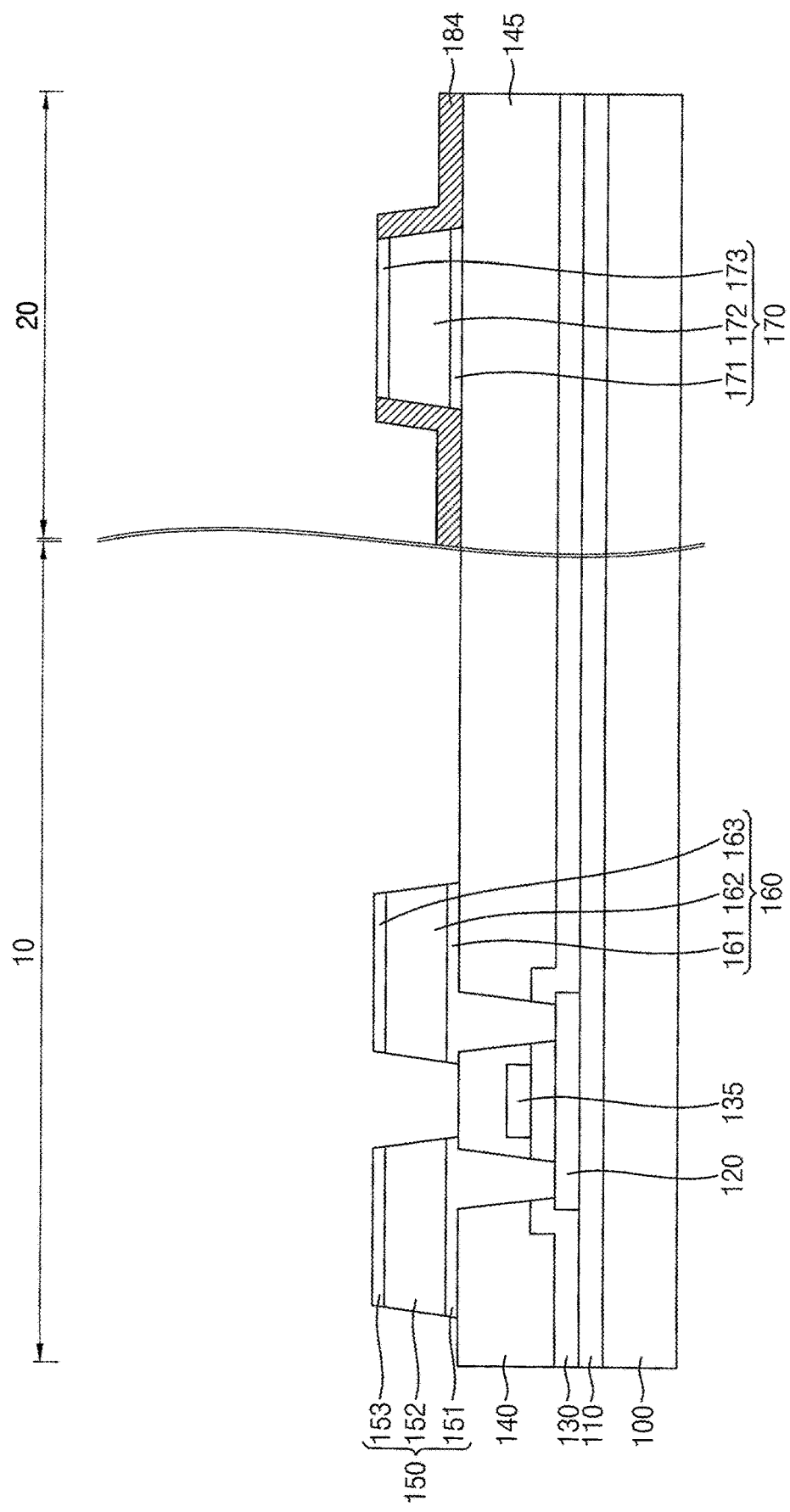

Referring to FIG. 14, the photoresist pattern 320 may be stripped in company with the second insulation layer 183 (refer to FIG. 13) that covers the photoresist pattern 320 so as to form the side protection layer 184. The side protection layer 184 may cover the sidewall of the pad electrode 170.

In an exemplary embodiment, the photoresist pattern 320 and the second insulation layer 183 that covers the photoresist pattern 320 may be stripped by a lift-off method. In an exemplary embodiment, as illustrated in FIG. 13, the second insulation layer 183 that covers the photoresist pattern 320 may be separated from the second insulation layer 183 that covers the top surface of the first insulation layer 145 and the sidewall of the pad electrode 170, for example. In this case, the second insulation layer 183 that covers the photoresist pattern 320 may be removed in company with the photoresist pattern 320 by the lift-off method.

Figure 15:
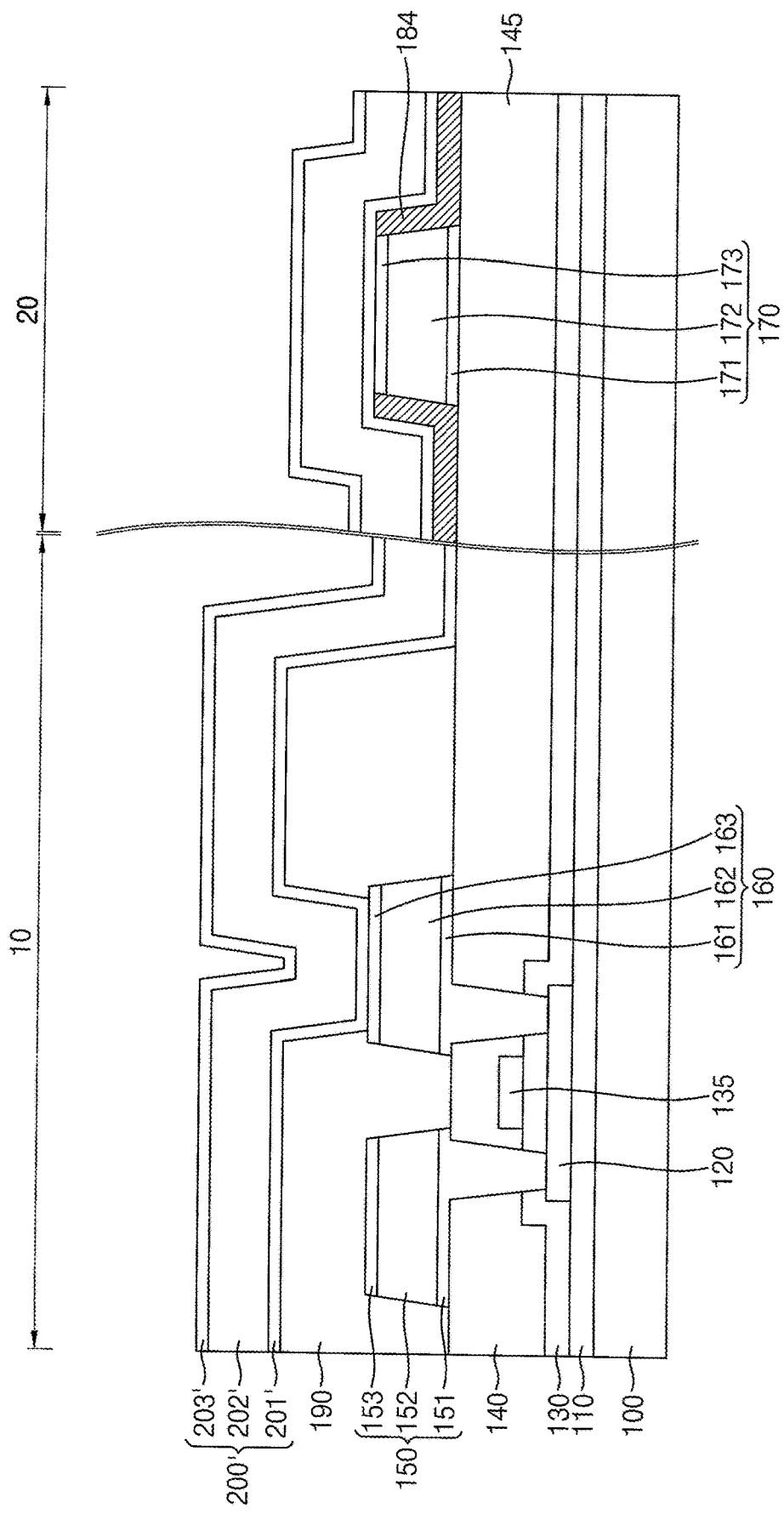

Referring to FIG. 15, a pixel electrode layer 200' may be disposed on the substrate 100 in the display region 10 and the pad region 20. The pixel electrode layer 200' may cover the pad electrode 170 and the side protection layer 184.

Figure 16:
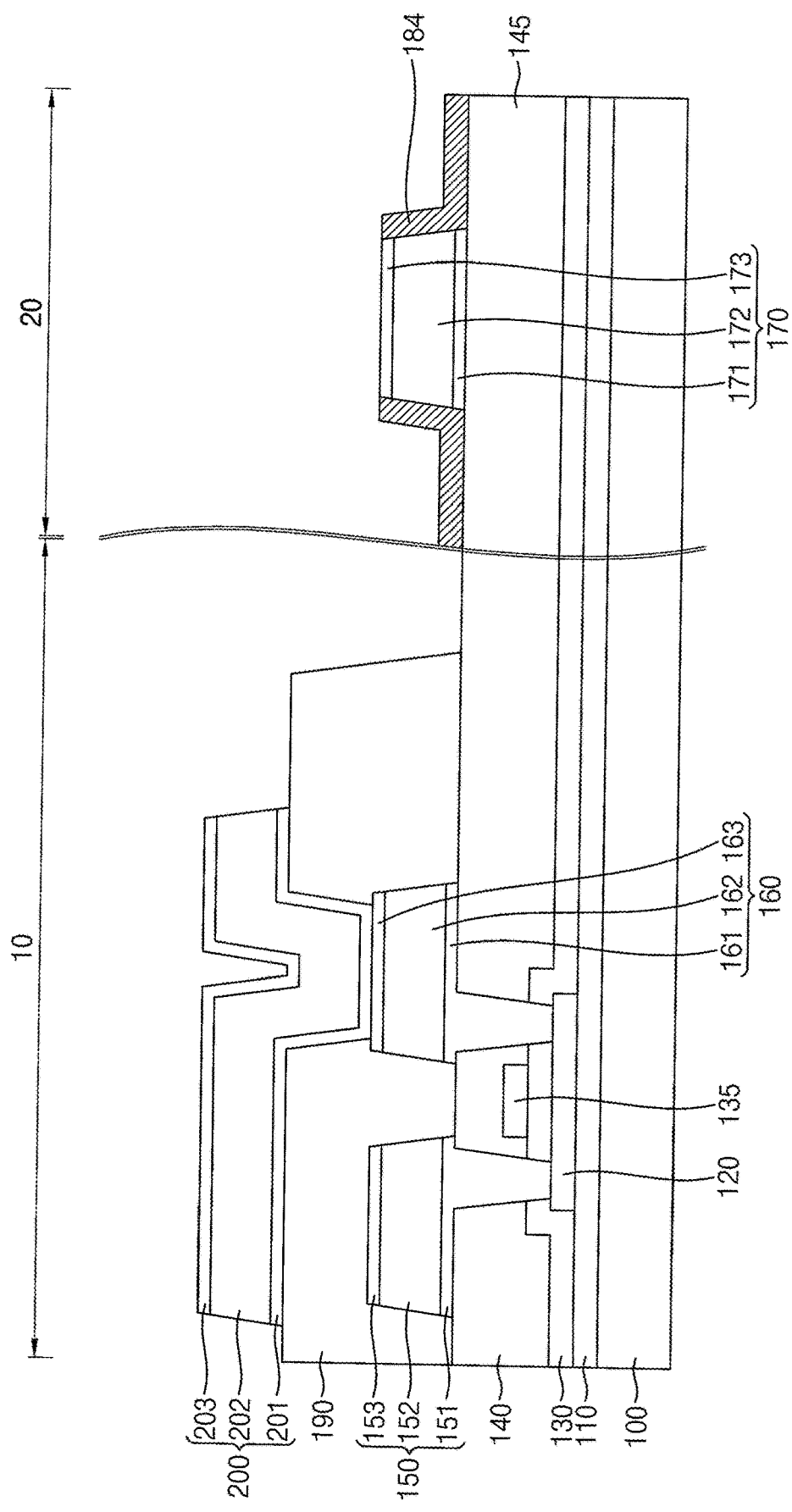

Referring to FIG. 16, the pixel electrode layer 200' may be etched by an etchant so as to form the pixel electrode 200 in the display region 10.

In an exemplary embodiment, the main pad layer 172 of the pad electrode 170 and the pixel electrode layer 200' may include materials that induce galvanic reaction in the presence of the etchant. In an exemplary embodiment, the main pad layer 172 and the second layer 202' of the pixel electrode layer 200' may include aluminum (Al) and silver (Ag), respectively, which induce galvanic reaction in the presence of the etchant, for example. The galvanic reaction is an electrochemical process in which a metal ion is reduced based on oxidation-reduction reaction when two metals having different standard reduction potentials are connected by an electrolyte.

Silver ion (Ag+) may be generated by phosphoric acid ($H_3PO_4$) included in the etchant when silver (Ag) included in the second layer 202' of the pixel electrode layer 200' contacts the etchant, which is an electrolyte. When the silver ion (Ag+) contacts aluminum (Al) included in the main pad layer 172, the silver ion (Ag+) may be reduced based on oxidation-reduction reaction so as to generate silver (Ag) particle, and aluminum (Al) may be oxidized.

According to a conventional method of manufacturing a backplane for a display device, a main pad layer of a pad electrode may be corroded based on the oxidation-reduction reaction between silver ion (Ag+) and aluminum (Al). Therefore, conductive paths may include silver (Ag) particles between pad electrodes, and the pad electrodes may be short-circuited. In order to prevent corrosions or short-circuit of the pad electrodes, the side protection layer 184 covering the sidewall of the pad electrode 170 may be provided in a method of manufacturing the backplane for the display device according to another exemplary embodiment. The auxiliary pad layers 171 and 173 may cover the bottom surface and the top surface of the main pad layer 172, and the side protection layer 184 may cover the sidewall of the main pad layer 172. Thus, the main pad layer 172 may not be exposed to a material generated when the pixel electrode layer 200' is wet-etched, and a damage of the pad electrode 170 may be prevented.

Referring back to FIG. 10, the pixel defining layer 210 may be disposed on the planarization layer 190 in the display region 10. The pixel defining layer 210 may cover the pixel electrode 200.

The backplane for the display device according to exemplary embodiments of the invention may be applied to a display device included in various electronic devices such as a computer, a notebook, a mobile phone, a smartphone, a smart pad, a portable media player ("PMP"), a personal digital assistant ("PDA"), an MP3 player, or the like.

Although the backplane for the display device and the method of manufacturing the backplane for the display device according to the exemplary embodiments of the invention have been described with reference to the drawings, the illustrated exemplary embodiments are examples, and may be modified and changed by a person having ordinary knowledge in the relevant technical field without departing from the technical spirit of the invention described in the following claims.

What is claimed is:

1. A backplane for a display device including a display region and a pad region, the backplane comprising:
    an insulation layer disposed on a substrate;
    a pad electrode disposed on the insulation layer in the pad region; and
    a side protection layer covering a sidewall of the pad electrode,
    wherein the pad electrode includes a main pad layer and auxiliary pad layers covering an entirety of a lower portion and an upper portion opposite the lower portion defining the main pad layer, and
    wherein the side protection layer extends from the insulation layer and terminates at a same height, which is taken along a direction perpendicular to an extension direction of the substrate, as a total height of the pad electrode including the main pad layer and the auxiliary pad layers extending from the insulation layer to a top surface of the pad electrode.

2. The backplane of claim 1, wherein the side protection layer only covers the sidewall of the pad electrode.

3. The backplane of claim 1, wherein the side protection layer covers the sidewall of the pad electrode and a top surface of the insulation layer.

4. The backplane of claim 1, further comprising:
    a drain electrode disposed on the insulation layer in the display region; and
    a pixel electrode disposed on the drain electrode in the display region, the pixel electrode being electrically connected to the drain electrode.

5. The backplane of claim 4, wherein the pad electrode is disposed on a same level as the drain electrode over the substrate and includes a same material as the drain electrode.

6. The backplane of claim 1, wherein
    the main pad layer and the pixel electrode include materials inducing a galvanic reaction in a presence of an electrolyte.

7. The backplane of claim 1, wherein any portion of the top surface defining the pad electrode is exposed and is not overlapped by any portion of the side protection layer.

8. The backplane of claim 1, wherein the side protection layer is disposed only in the pad region, and is not disposed in the display region.

* * * * *